United States Patent
Seitz et al.

(10) Patent No.: US 7,034,352 B2
(45) Date of Patent: Apr. 25, 2006

(54) DRAM WITH VERY SHALLOW TRENCH ISOLATION

(75) Inventors: Mihel Seitz, Radebeul (DE); Venkatachalam C. Jaiprakash, Fremont, CA (US)

(73) Assignee: Infineon Technologies AG, Munich (DE)

( * ) Notice: Subject to any disclaimer, the term of this patent is extended or adjusted under 35 U.S.C. 154(b) by 45 days.

(21) Appl. No.: 10/777,332

(22) Filed: Feb. 11, 2004

(65) Prior Publication Data

US 2005/0173748 A1    Aug. 11, 2005

(51) Int. Cl.
    *H01L 27/108*    (2006.01)
(52) U.S. Cl. .............. 257/301; 257/296; 257/302; 257/303; 257/304; 257/305
(58) Field of Classification Search .............. None
    See application file for complete search history.

(56) References Cited

U.S. PATENT DOCUMENTS

| | | | |
|---|---|---|---|
| 5,229,316 A | | 7/1993 | Lee et al. |
| 5,395,786 A | * | 3/1995 | Hsu et al. .................... 438/248 |
| 5,831,301 A | * | 11/1998 | Horak et al. ................ 257/302 |
| 6,080,618 A | * | 6/2000 | Bergner et al. .............. 438/243 |
| 6,184,107 B1 | * | 2/2001 | Divakaruni et al. ........ 438/427 |
| 6,242,310 B1 | * | 6/2001 | Divakaruni et al. ........ 438/268 |
| 6,309,924 B1 | * | 10/2001 | Divakaruni et al. ........ 438/243 |
| 6,339,241 B1 | * | 1/2002 | Mandelman et al. ....... 257/301 |
| 6,437,381 B1 | * | 8/2002 | Gruening et al. ........... 257/296 |
| 6,570,208 B1 | * | 5/2003 | Mandelman et al. ....... 257/302 |
| 6,573,137 B1 | * | 6/2003 | Divakaruni et al. ........ 438/248 |
| 6,667,504 B1 | * | 12/2003 | Beintner et al. ............ 257/302 |
| 6,693,041 B1 | * | 2/2004 | Divakaruni et al. ........ 438/702 |
| 6,809,368 B1 | * | 10/2004 | Divakaruni et al. ........ 257/302 |
| 2004/0248363 A1 | * | 12/2004 | Bard et al. .................. 438/243 |
| 2005/0056873 A1 | * | 3/2005 | Sommer et al. ............ 257/296 |
| 2005/0093044 A1 | * | 5/2005 | Cheng et al. ............... 257/296 |
| 2005/0127422 A1 | * | 6/2005 | Hsiao et al. ................ 257/301 |

OTHER PUBLICATIONS

U. Gruening, et al, "A Novel Trench DRAM Cell with a VERtIcal Access Transistor and BuriEd STrap (VERI BEST) for 4Gb/16Gb," 0-7803-5413-3/99, 1999 IEEE, pp. 1-4.
W. Neumueller, et al., "DRAM Technology For Today's Market And Future DRAM Generations," pp. 1-8.
C.J. Radens, "An Orthogonal $6F^2$ Trench-Sidewall Vertical Device Cell for 4Gb/16Gb DRAM," 0-7803-6441-4/00 2000 IEEE, pp. 1-4.

* cited by examiner

*Primary Examiner*—Andy Huynh
(74) *Attorney, Agent, or Firm*—Slater & Matsil, L.L.P.

(57) ABSTRACT

The methods and structures of the present invention involve providing a vertical dynamic random access memory (DRAM) cell device comprising a buried strap which can be laterally constrained, thereby maintaining freedom from cross talk, even at 6F2 scaling, in the absence of adjacent Shallow Trench Isolation (STI). The methods and structures of the present invention involve the further recognition that the STI can therefore be vertically confined, freed of any need to extend down below the level of the buried strap. The reduction of the buried strap to 1F width and the concomitant reduction in the depth of the STI together permit a significantly reduced aspect ratio, permitting critically improved manufacturability.

15 Claims, 8 Drawing Sheets

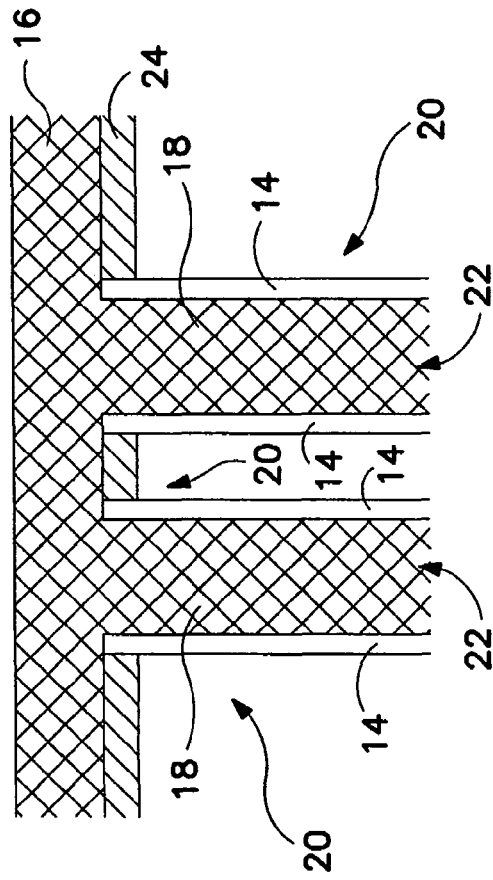
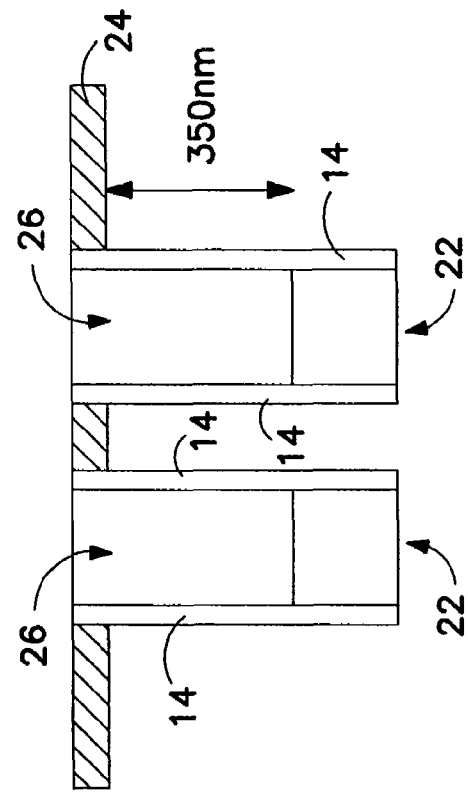
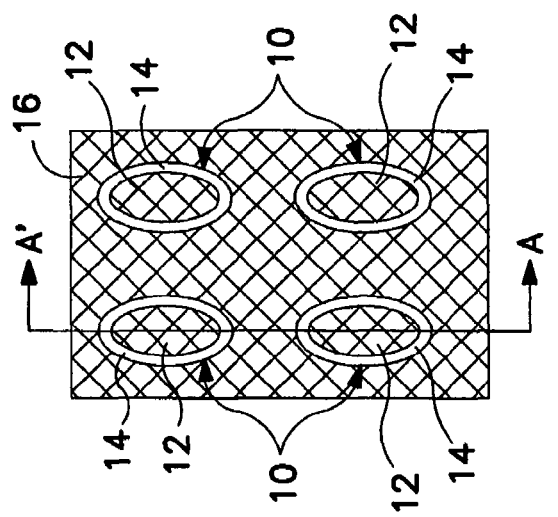
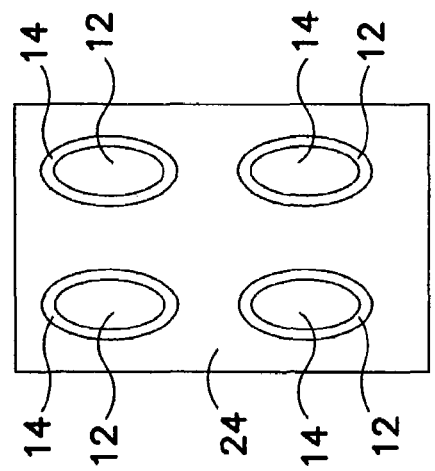

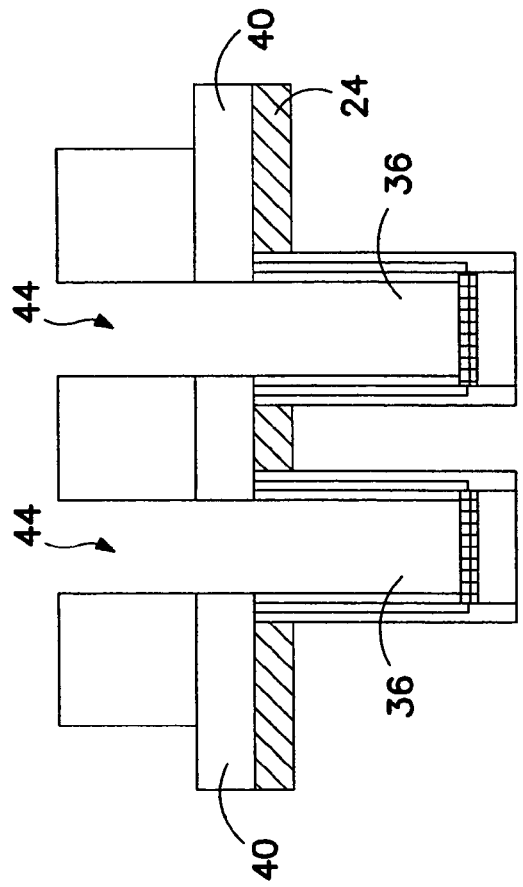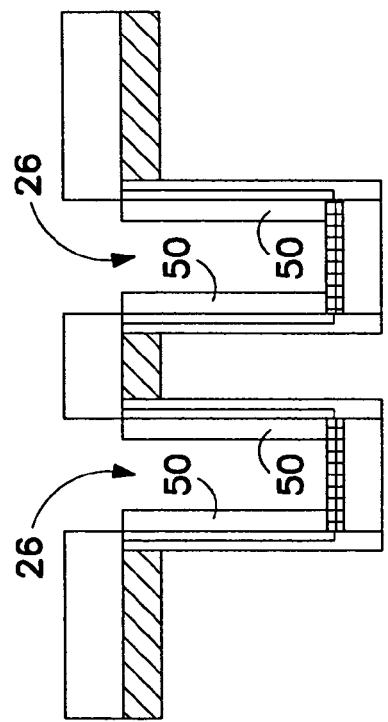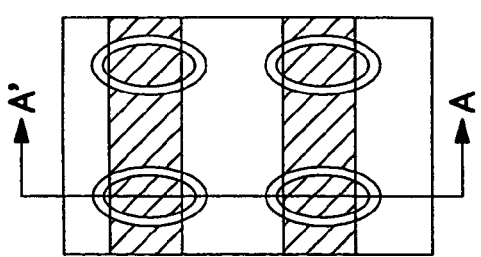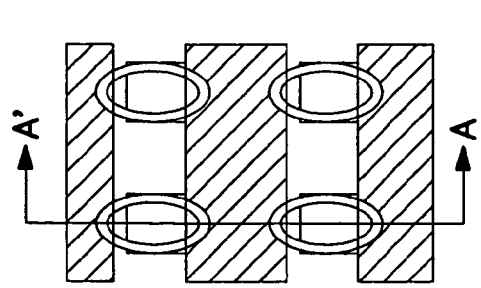

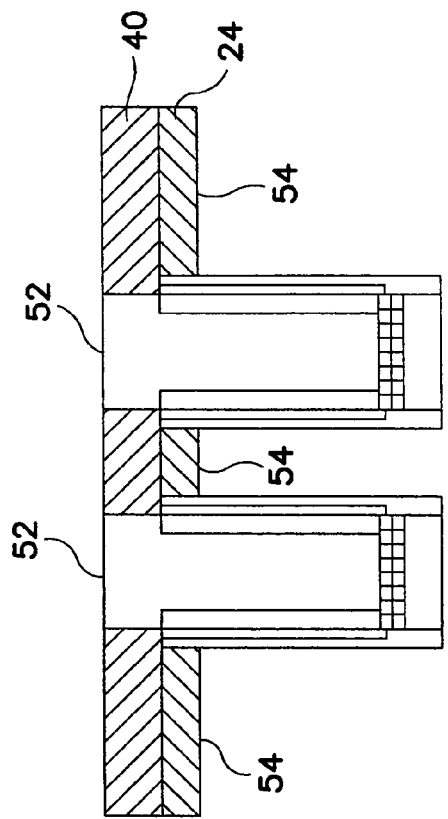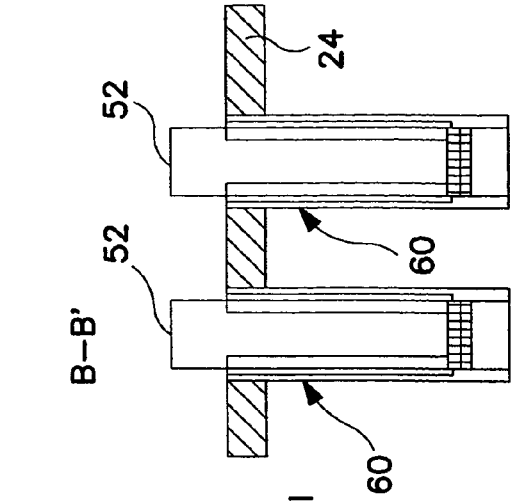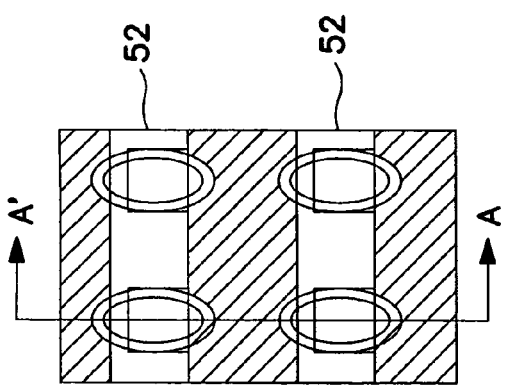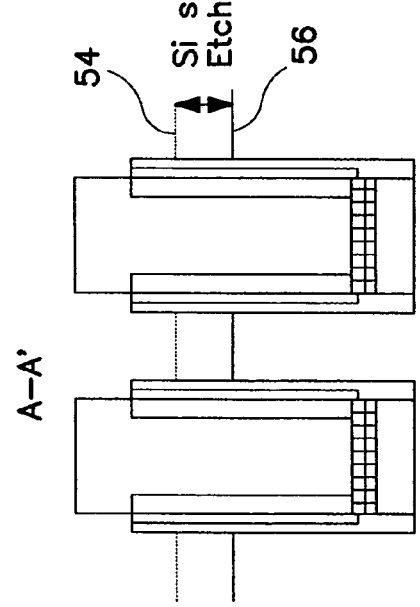
FIG. 8A  FIG. 8B  FIG. 9A  FIG. 9B  FIG. 9C

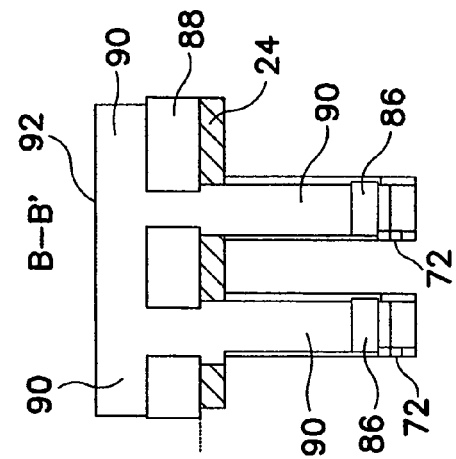
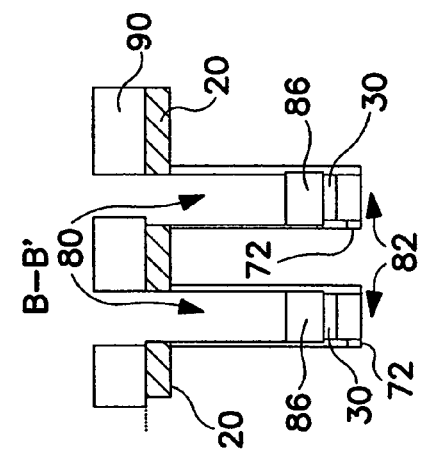
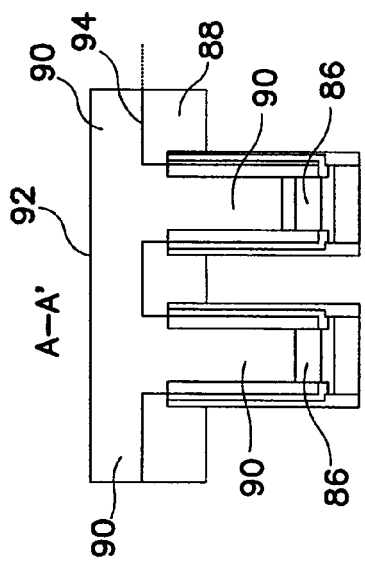
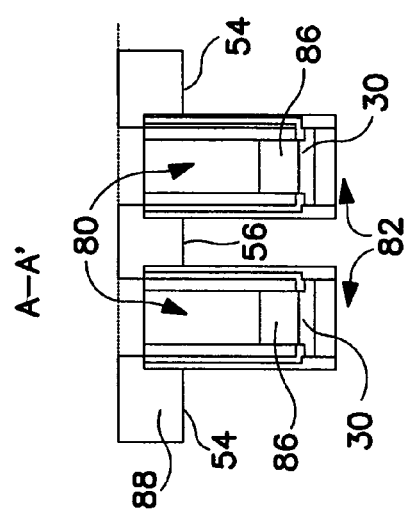
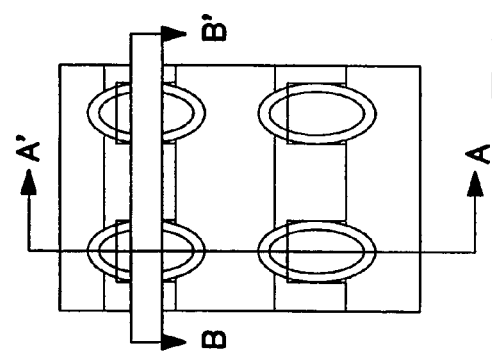
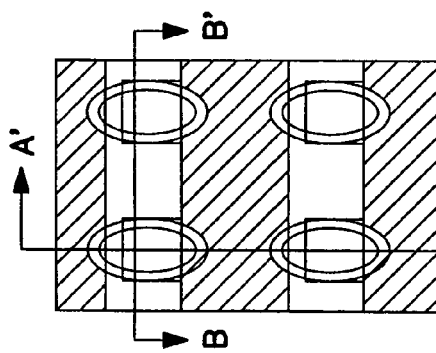

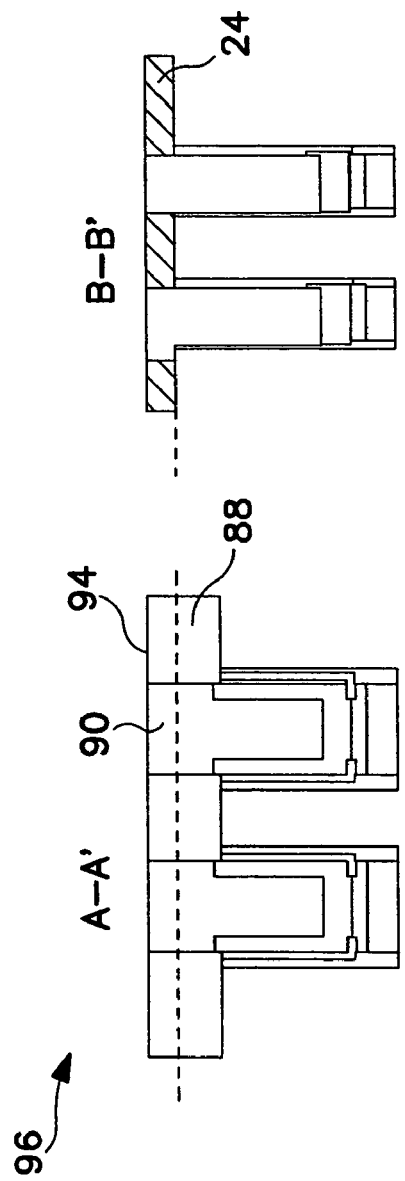
FIG. 13A
FIG. 13B
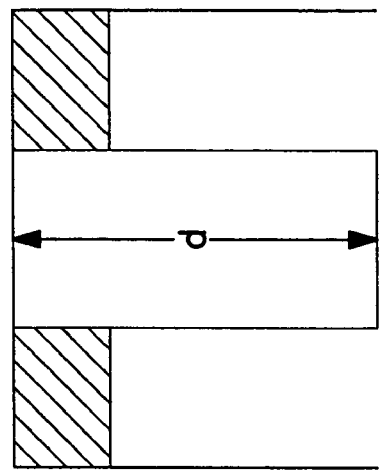
FIG. 14B
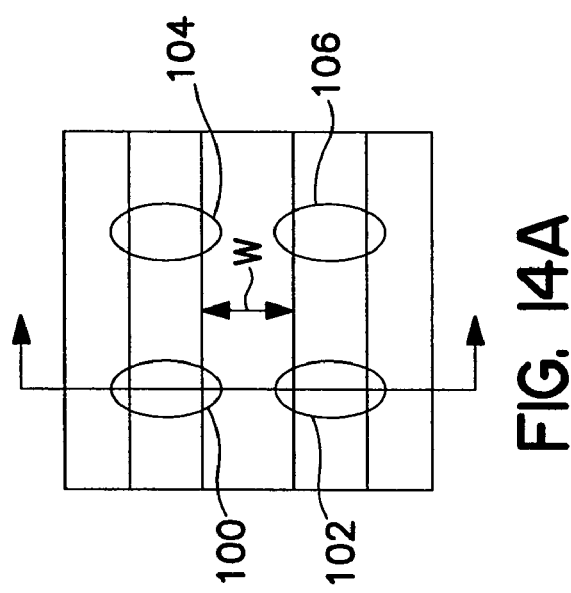
FIG. 14A

DRAM WITH VERY SHALLOW TRENCH ISOLATION

FIELD THE OF INVENTION

The present invention relates to dynamic random access memory (DRAM) structures, in particular, to vertical DRAM structures.

BACKGROUND OF THE INVENTION

With the constant drive towards increasing both the operating speeds and capacity of DRAM devices, advances in DRAM technology are directed at reductions in device minimum feature size (F) and achieving more compact cell layouts through reduced device footprint. Reduction in scale of planar DRAM devices is limited by stringent leakage requirements, however. A reduction in gate poly length requires thinner gate oxides, while the reduction in gate poly length (i.e., channel length) requires increased channel doping to avoid short channel effects. High doping levels, on the other hand, increase junction leakage which, in turn, decreases data retention time. These and other challenges surrounding the scaling of planar DRAM devices have provided the motivation for vertical transistors. These devices introduce both additional degrees of freedom as well as constraints in the design of conventional planar devices.

The design of the resulting vertical devices has involved an asymmetric cell structure, in which the transistor and the corresponding buried strap (e.g., one-sided strap or "OSS") are formed along the upper region of a trench capacitor. The OSS lies along one vertical edge of the cell device between the transistor and capacitor. However, positioning multiple devices in close physical proximity to one another introduces a potential for electrical cross-talk between cells, entailing defective operation of the devices. This risk has been mitigated by introducing shallow trench isolation ("STI"), which provides lateral isolation between adjacent cells. The STI may extend approximately 200–400 nm below the buried strap.

This resulting configuration, while theoretically advantageous, suffers from manufacturing difficulties that are related to the fabricated STI. As the feature size of the vertical DRAM device decreases, the resulting aspect ratio of the device, defined as depth of trench divided by trench separation, increases. This makes the device difficult to form using known processes without the formation of unacceptable voids and other defects. In essence, the resulting increase in aspect ratio of a trench, which can fall in the range of 4–8, may turn out to be difficult to fill properly with oxide. Though intended to neatly fill it from the bottom, as the oxide is deposited into the space allocated for the formation of the STI it tends also to grow at the side walls. This growth can occur to such an extent that the resulting side wall formations actually touch, forming a structure having a shape reminiscent of that of a bishop's mitre. This undesired structure interrupts the downward flow of oxide, leading to the formation of undesirable voids. In addition to being unpredictable, the voids undermine the electrical characteristics of the STI and defeat its purpose.

Accordingly, there is a need for a solution to the problems associated with forming STI as the device minimum feature size (F) shrinks. Moreover, there is a need to form STI using a practical approach to the manufacture of vertical DRAMs.

SUMMARY OF THE INVENTION

The present invention solves at least in part the long felt, but unmet, needs described above. In particular, the methods and structures of the present invention involve the recognition that the buried strap of a vertical DRAM structure can be laterally constrained, thereby maintaining freedom from cross talk in the absence of an adjacent STI, even at 6F2 scaling (where F2 is the square of the minimum feature size and 6F2 is the minimum size of a unit cell having a transistor and storage node, i.e., the 6F2 unit cell area is six times the minimum feature size area). The methods and structures of the present invention involve the further recognition that the STI can therefore be vertically confined, freed of any need to extend down below the level of the buried strap. The reduction of the buried strap to 1F width and the concomitant reduction in the depth of the STI together permit a significantly reduced aspect ratio, in turn enabling critically improved manufacturability and resulting in an integration scheme capable of allowing scalability of the 6F2 cell to 60 nm ground rules. An aspect of the present invention provides a vertical dynamic random access memory (DRAM) cell device fabricated within a trench region in a substrate, the trench having first and second opposing substantially vertical edges. The vertical DRAM cell comprises a storage capacitor formed within the trench region for storing electrical charge, a transistor formed within the trench region above the storage capacitor, and a buried strap formed on the first vertical edge between the storage capacitor and the transistor. An isolation collar region is formed on the second vertical edge of the trench, such that the isolation collar extends the length of the transistor. The isolation collar has a bottom edge that is vertically separated from the top surface of the trench by about 500 to 1000 nm.

Another aspect of the present invention provides a buried strap for electrically connecting a transistor and a storage capacitor in a vertical dynamic random access memory (DRAM) cell device formed within a semiconductor substrate, wherein the DRAM cell comprises a trench having a first and a second opposing vertical edge, where the buried strap comprises: an electrically conducting region formed within the trench, wherein the electrically conducting region is formed proximate to the first opposing edge between the transistor and storage capacitor, and laterally displaced from an isolation region formed on the second opposing vertical edge. The isolation region extends from the semiconductor substrate surface along the second opposing vertical edge and terminates no lower than the electrically conductible region.

Yet another aspect of the present invention provides shallow trench isolation in a vertical dynamic random access memory (DRAM) cell device having a storage capacitor and a transistor formed in a trench region. The trench region has a first edge, a second edge, and a trench bottom, whereby the trench extends vertically downwards from a semiconductor substrate surface to the trench bottom. The method comprises: isolating a region adjacent to the first edge of the trench, where the isolated region extends vertically downwards from the semiconductor substrate surface in the direction of the trench bottom to a depth, wherein the region is isolated from at least one DRAM cell device which is proximate to the first edge. The method further comprises connecting the storage capacitor to the transistor at a connection location adjacent to the second edge of the trench, whereby the connection location is laterally displaced from the isolated region adjacent to the first edge. The isolated region terminates no lower than the connection location adjacent to the second edge.

Another aspect of the present invention provides a method of fabricating an isolation region for shallow trench isolation in a vertical dynamic random access memory (DRAM) cell device having a transistor and a capacitor formed in a trench, the trench having a first edge and an opposing second edge, whereby the method comprises: lining the first edge and opposing second edge of the trench with an oxide material and partially filling the trench with polysilicon, wherein the polysilicon has a top surface. The oxide material lining is removed from the first edge of the trench and a divot is formed in the surface of the polysilicon proximate to the first edge of the trench. The divot in the polysilicon is then filled with an electrically conductive material, whereby the electrically conductive material forms a buried strap.

An aspect of the present invention further provides a vertical dynamic random access memory (DRAM) device comprising: a plurality of cell devices, where each of the plurality of cell devices comprises a trench having a trench depth and substantially vertical opposing edges. The respective vertical opposing edges of an adjacent pair of the plurality of cell devices are separated by a separation width, whereby the ratio between the trench depth and the separation width between the adjacent pair of cell devices comprises a value of less than about 1.5.

BRIEF DESCRIPTION OF THE DRAWINGS

FIG. 1A illustrates a top plan view of a portion of an embodiment of DRAM memory device in accordance with the present invention, in which four vertical DRAM cell footprints are shown.

FIG. 1B illustrates a cross sectional view along the A–A' axis of FIG. 1A, which shows the trench regions of the vertical DRAM cells.

FIG. 2A illustrates another top plan view of a portion of the DRAM memory device in accordance with the present invention, where silicon nitride is selectively deposited on the device surface.

FIG. 2B illustrates a cross sectional view along the A–A' axis of FIG. 2A, which shows the deposited polysilicon layer within the trench regions.

FIG. 6A illustrates a top plan view of a portion of the DRAM memory device in accordance with the present invention, where areas not covered by the resist are etched.

FIG. 6B illustrates a cross sectional view along the A–A' axis of FIG. 6A, where polysilicon is etched from within the trench regions.

FIG. 7A illustrates a top plan view of a portion of the DRAM memory device in accordance with the present invention, where oxide is deposited within the trench.

FIG. 7B illustrates a cross sectional view along the A–A' axis of FIG. 7A, where an oxide lining is deposited on the trench walls.

FIG. 8A illustrates a top plan view of the DRAM memory device, where an etch resist material is deposited within the trench.

FIG. 8B illustrates a cross sectional view along the A–A' axis of FIG. 8A, where the etch resist fills the trench region.

FIG. 9A illustrates a top plan view of the DRAM memory device, where an oxide and silicon nitride layer are etched from the surface.

FIG. 9B illustrates a cross sectional view along the A–A' axis of FIG. 9A, where both the oxide and silicon nitride layer are etched from the surface of the device.

FIG. 9C illustrates a cross sectional view along the B–B' axis of FIG. 9A, where the oxide layer is etched from the surface of the device.

FIG. 11A illustrates a top plan view of the DRAM memory device, where an oxide is deposited to form a Trench top oxide.

FIG. 11B illustrates a cross sectional view along the A–A' axis of FIG. 11A, where oxide is deposited within the trench recess and the device surface.

FIG. 11C illustrates a cross sectional view along the B–B' axis of FIG. 11A, where oxide is deposited within the trench recess and the device surface.

FIG. 12A illustrates a cross sectional top plan view of the DRAM memory device, where polysilicon is deposited within the trench and over the device surface.

FIG. 12B illustrates a cross sectional view along the A–A' axis of FIG. 12A, where polysilicon fills the trench and covers the surface oxide.

FIG. 12C illustrates a cross sectional view along the B–B' axis of FIG. 12A, where polysilicon fills the trench and covers the surface oxide.

FIG. 13A illustrates a cross sectional view along the A–A' axis of FIG. 12A, where chemical mechanical polishing (CMP) is applied to the polysilicon and oxide surfaces.

FIG. 13B illustrates a cross sectional view along the B–B' axis of FIG. 12A, where Chemical Mechanical Polishing (CMP) removes the polysilicon layer on the surface of the device.

FIG. 14A illustrates a top plan view of the device, where the separation between vertical DRAM cells is shown.

FIG. 14B illustrates a top plan view of the device, where the trench depth of a vertical DRAM cell is shown.

DETAILED DESCRIPTION

Figure 3:
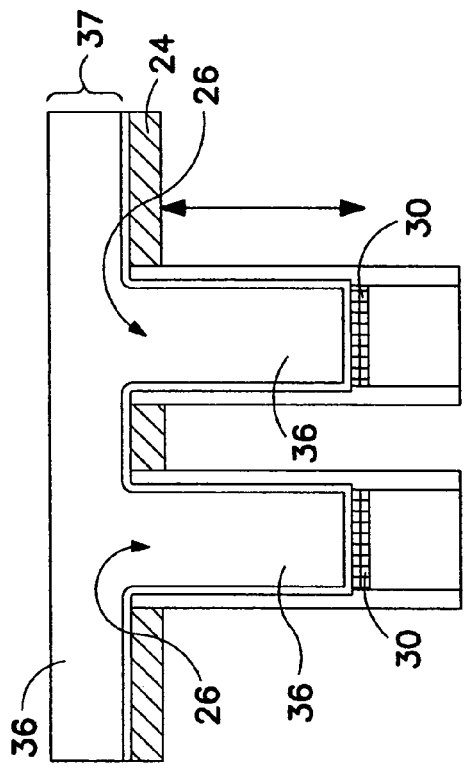
FIG. 3 illustrates a cross sectional view of the trench regions, where oxide is deposited within the trench regions.

FIG. 1A illustrates a top view of four vertical DRAM cell footprints 10 corresponding to four vertical DRAM cells during fabrication of a shallow trench isolation (STI) region in an embodiment of the present invention. The four vertical DRAM cells are depicted for purposes of illustration only. A typical DRAM device will typically incorporate a large number of cell devices having different layout or footprint arrangements. Each footprint 10 includes a doped polysilicon pad 12 and a collar oxide region (which can also be referred to more generally as an isolation collar) 14, the collar oxide 14 forming the perimeter of pad 12.

FIG. 1B shows a cross sectional view along A–A' of the structure shown in FIG. 1A. As illustrated in the figure, each doped polysilicon pad 12 (FIG. 1A) corresponds to a vertical trench 22 extending from the device surface into semiconductor substrate region 20. Each vertical trench 22 has been filled with doped polysilicon, as indicated by polysilicon regions 18. Also, as illustrated in FIGS. 1A and 1B, undoped polysilicon surface 16 surrounds collar oxide regions 14 and pads 12. The collar oxide 14 is an integral part of vertical DRAM cell fabrication in that it prevents electrical discharge of the capacitor due to an uncontrolled parasitic transistor leading to an unwanted electric current path within the DRAM cell. As illustrated in FIG. 2A, conventional masking or lithography techniques are used to deposit a layer of silicon nitride 24 onto undoped polysilicon surface 16 (FIG. 1A). The silicon nitride 24 is deposited on both undoped polysilicon surface 16 (FIG. 1A) and collar oxide regions 14. Only the doped polysilicon pads 12 (FIG. 1A) are not covered with the deposited silicon nitride 24. As shown in FIG. 2B, polysilicon regions 18 (FIG. 1B) are etched down to a depth of between approximately 200–400 nm to form a recess 26 within each trench region 22.

As illustrated in FIG. 3, following the etching of polysilicon regions 18, an oxide pad layer 30 is deposited within recess regions 26 onto surface 23 of the remaining polysilicon. A silicon nitride liner 32 is then deposited over the inner surfaces or walls of recess regions 26. As silicon nitride is deposited, the silicon nitride liner 32 is also deposited over silicon nitride layer 24.

Figure 4:
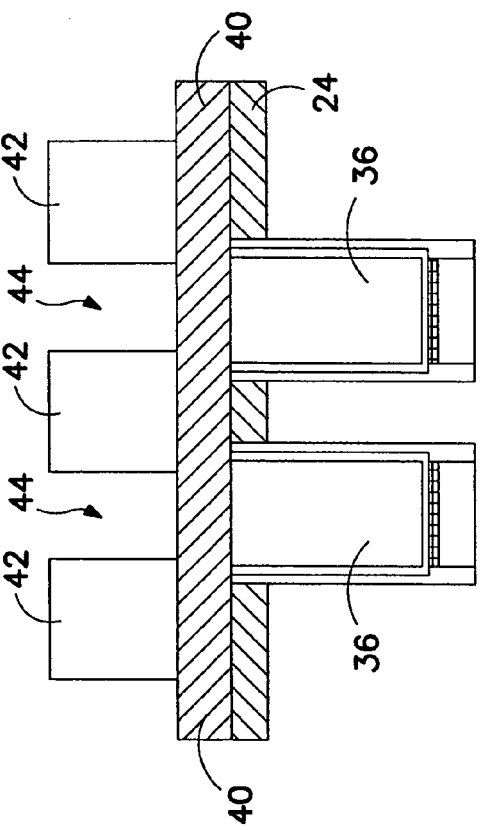
FIG. 4 illustrates a cross sectional view of the trench region, where polysilicon is deposited over the deposited oxide.

As illustrated in FIG. 4, once silicon nitride liner 32 is deposited, undoped polysilicon 36 is filled within recess region 26 and over silicon nitride layer 24. The polysilicon 36 that fills recess 26 also form a layer of polysilicon 37 over the silicon nitride layer 24.

Figure 5A:
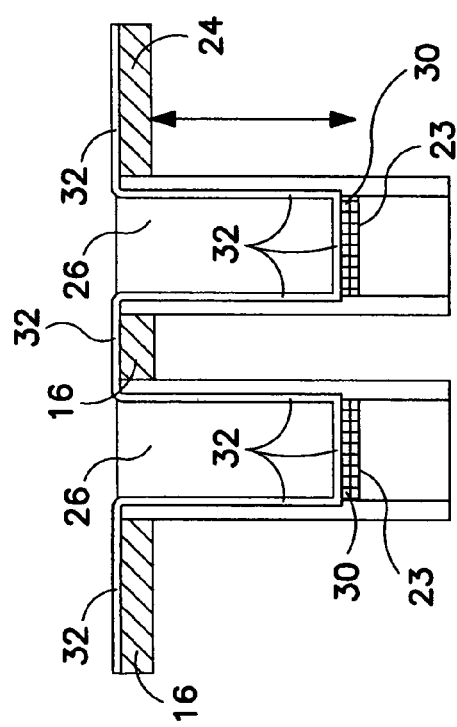
FIG. 5A illustrates another top plan view of a portion of the DRAM memory device in accordance with the present invention, where the device surface is patterned with an etch resist.
Figure 5B:
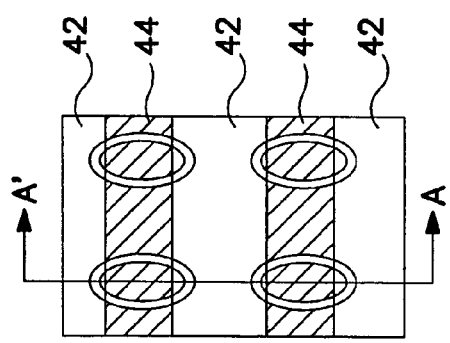
FIG. 5B illustrates a cross sectional view along the A–A' axis of FIG. 5A.

FIG. 5B illustrates step of chemical mechanical polishing (CMP) the deposited undoped polysilicon 36 or other suitable treatment. Following the CMP process, an oxide layer 40 is deposited over the silicon nitride layer 24. The thickness of this layer is approximately 1.5 times the thickness of the silicon nitride layer 24. FIG. 5B also further illustrates etch resist mask 42 formed over oxide layer 40, where the mask 42 provides selective etching of regions 44 that are not protected by mask 42. FIG. 5A shows a top plan view of FIG. 5B, and illustrates etch resist mask 42 and regions 44. FIG. 5B is a cross-sectional view along axis A–A' of FIG. 5A.

FIG. 6B illustrates the etch process of regions 44 shown in FIGS. 5A and 5B, in a cross-sectional view of FIG. 6A taken along axis A–A'. The undoped polysilicon 36 within recess regions 26 (FIG. 5B), and the portion of silicon nitride liner 32 that had been formed on the top surface of oxide pad layer 30 has been etched away. Following the etching, only an undoped polysilicon liner 46 remains deposited on the inner vertical walls of recess regions 26. Silicon nitride layer 24 and oxide layer 40 within regions 44 were also etched.

The undoped polysilicon liner 46 (FIG. 6B) deposited on the inner walls of recess region 26 is oxidized, as illustrated in FIG. 7B, a cross sectional view of FIG. 7A taken along axis A–A'. FIG. 7B also shows that the etch resist mask 42 is removed.

Following the formation of oxidized polysilicon liner 50 (FIG. 7B), recess regions 26 are filled with an etch resist material 52, as illustrated in FIG. 8B. FIG. 8B also shows oxide layer 40 and silicon nitride layer 24 that have been deposited on the silicon surface 54 of the semiconductor material used to fabricate the vertical DRAM cells. FIG. 8B is a cross-sectional view of FIG. 8A taken along axis A–A', where figure 8A shows a top view of the etch resist material 52.

Figure 10A:
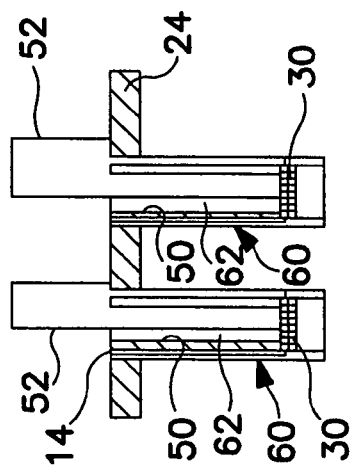
FIG. 10A illustrates a vertical opening within the etch resist-filled trench shown in FIG. 9C.

FIG. 8A shows the etching of oxide layer 40 and silicon nitride layer 24 down to the silicon surface 54. As shown in the figure, an additional layer of silicon is etched away, taking the silicon surface down to a level indicated at 56. This etching process is carried out in the direction of axis A–A' shown in FIG. 9A, where FIG. 9B shows a cross sectional view of A–A'. FIG. 9C shows a cross sectional view of FIG. 9A taken along axis B–B'. As illustrated, oxide layer 40 is etched down to the silicon nitride layer 24. As illustrated in FIG. 10A, the etch resist material 52 filling recess regions 26 (FIG. 7B) is partially etched along vertical edges 60. This creates a vertical channel opening 62 down each of the vertical edges 60. Vertical channel opening 62 allows further etching for generating a buried strap. The buried strap connects the transistor (not shown) and the capacitor (not shown) of a single unit cell to form a DRAM storage node within each trench region 22 (FIG. 1B). As shown in FIG. 10A, the areas surrounding vertical channel opening 62 that are not covered by etch resist 52 are further etched.

Figure 10B:
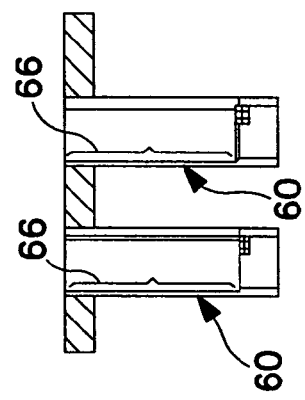
FIG. 10B illustrates the removal of a portion of collar oxide from the vertical edge of the trench.

As illustrated in FIG. 10B, the oxidized polysilicon liner 50 (FIG. 10A) along vertical edges 60 is etched away, including a partial section of oxide pad layer 30. FIG. 10B also shows that a portion of collar oxide 14 (FIG. 10A) along vertical edges 60 is etched. This portion along each vertical edge 60 is defined by 66.

Figure 10C:
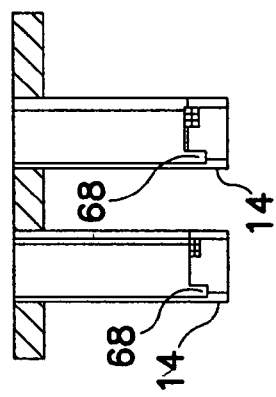
FIG. 10C illustrates the formation of a divot in the collar oxide region.
Figure 10D:
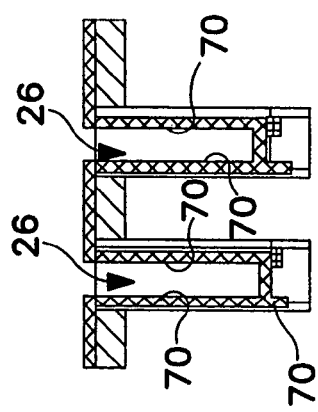
FIG. 10D illustrates deposited polysilicon for filling the divot and producing a buried strap.

As shown in FIG. 10C, an opening or divot 68 is etched into the upper portion of oxide pad layer 30. Once divot 68 has been formed, an electrically conductive material, such as doped or undoped polysilicon 70, is deposited into recess regions 26, as shown in FIG. 10D. As a result of the deposited polysilicon 70, the inner walls of the recess regions 26 are covered by doped or undoped polysilicon 70. Accordingly, divot 68 is also filled with deposited doped or undoped polysilicon 70.

Figure 10E:
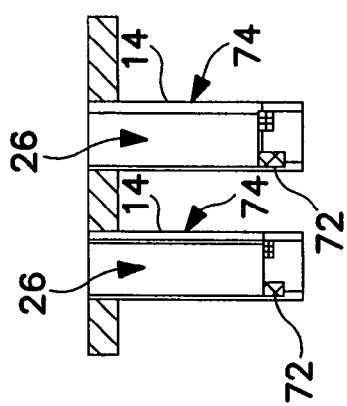
FIG. 10E illustrates removing excess polysilicon from the walls of the trench following the divot fill process shown in FIG. 10D.

As illustrated in FIG. 10E, the polysilicon filled divot then forms a buried strap 72. FIG. 10E further illustrates the removal of excess deposited polysilicon 70 from the inner walls with recess regions 26.

Figure 10F:
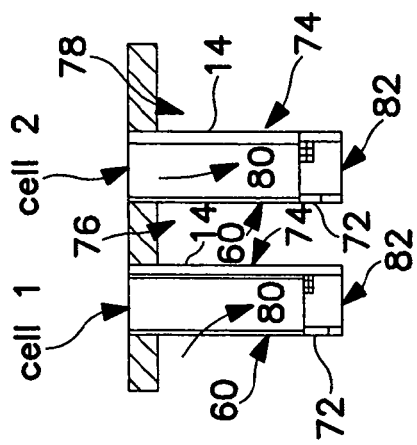
FIG. 10F illustrates the removal of the silicon nitride lining from the collar regions.

FIG. 10F shows collar oxide 14, where the silicon nitride deposited over each collar oxide 14 adjacent to edges 74 is removed. As illustrated, each buried strap 72 is laterally displaced from the opposing oxide collar 14 on vertical edge 74. Each opposing oxide collar 14 forms a Shallow Trench Isolation (STI) region 76 and vertically terminates above buried strap 72 located adjacent vertical edge 60. The strap can be flush with the vertical edge, as shown, or set further in from the edge, provided that its distance from vertical edge 74 is sufficient, e.g., about 50–150 nm in an embodiment of this aspect of the present invention, to isolate buried strap 72 from an adjacent cell proximate to vertical edge 74, as described below. In one embodiment, buried strap 72 has a vertical dimension in the range of about 30 to 150 nm and a lateral dimension in the range of about 50 to 100 nm.

The shallow trench isolation region 76 provides electrical isolation between adjacent DRAM cells 1 and 2 that have been formed in trench regions 22 (FIG. 1). These isolation regions avoid electrical cross talk between the capacitor and transistor devices (not shown) of each adjacent DRAM cell, while buried strap 72 provides electrical connectivity between the capacitor and transistor devices within each cell. In relation to both vertical DRAM cells 1 and 2 shown in FIG. 10F, the capacitor device is formed below the buried strap 72, while the transistor device is formed above the strap 72. The actual transistors and capacitors formed within the trench regions have not been illustrated or described herein as these device and their fabrication are know in the art. As shown in FIG. 10F, region 80 is where a transistor is formed, and region 82 is where a capacitor is formed.

In one embodiment of this aspect of the present invention, the depth of the STI region 76 is less than or equal to about 250 to 350 nm. Even more shallow depths, such as from 50 to 150 nm or less, may also be desirable and within the scope of the present invention. STI region 78 provides similar isolation between cell 2 and another adjacent DRAM device (not shown). Within each cell, the lateral displacement of the buried strap 72 with respect to the oxide collar 14 enables the oxide collar 14 to terminate roughly at or even above the buried strap 72 in the vertical direction, which allows for a shorter depth of isolation and thus a shallower trench. In one embodiment of this aspect of the present invention, the collar oxide 14 has a bottom edge extending below the vertical location of the top surface of the buried strap by about 50–100 nm and vertically separate from the top surface of the trench by about 500–1000 nm.

Once the buried strap 72 is formed, a trench top oxide (TTO) layer 86 is deposited over oxide pad layer 30, as shown in FIG. 11B. As illustrated, this oxide deposition process produces an oxide layer 88 on the silicon surface 54 of the semiconductor material used to fabricate the vertical DRAM cells. FIG. 11B is a cross sectional view of FIG. 11A taken along axis A–A' (major axis of trench), whereas FIG. 11C is a cross sectional view of FIG. 11A taken along axis B–B' (minor axis of trench). As illustrated in FIG. 11C, the oxide deposition process produces an oxide layer 90 over silicon nitride layer 24 as well. In one embodiment of this aspect of the present invention, the top portion of the buried strap 72 may vertically separated from the bottom surface of the TTO layer 86 by about 150 to 450 nm.

The TTO layer 86 isolates the gate (not shown) of the transistor formed in region 80, from the capacitor formed in region 82. Therefore, as shown in FIG. 11C, the electrical connection between the transistor drain or source and the capacitor is provided through buried strap 72. Applying appropriate voltage to the gate generates a low channel resistance between the drain and source of the transistor, thus allowing the capacitor to charge or discharge through the low resistance channel, which electrically connects the capacitor to a bitline (not shown).

Region 80 of the trench, in which the transistor is partly formed, is filled with polysilicon as shown in FIGS. 12B and 12C. As shown in both FIGS. 12B and 12C, polysilicon filler 90 is deposited over TTO layer 86, filling the trench completely, and covering oxide layer 88. FIG. 12B is a cross sectional view of FIG. 12A taken along axis A–A' (major axis of trench), and FIG. 12C is a cross sectional view of FIG. 12A taken along axis B–B' (minor axis of trench). Chemical Mechanical Polishing (CMP) is then applied to the surface 92 of the polysilicon filler 90, as shown in FIGS. 12B and 12C.

The effect of the CMP process in planarizing surface 92 is illustrated in FIGS. 13A and 13B. As illustrated in the cross sectional view along the B–B' axis (FIG. 13B), the layers of polysilicon filler 90 (FIG. 12C) deposited on top of oxide layer 88 (FIG. 12C), and the oxide layer 88 (FIG. 12C) are polished down to silicon nitride layer 24. As illustrated in FIG. 13A, following the CMP process, the polysilicon filler 90 is polished down to the top surface of oxide layer 88. Using know conventional techniques, word and bit line connections are applied to each Vertical cell DRAM device, such as cell device 96 illustrated in FIGS. 13A and 13B.

FIG. 14A shows the separation "W" (width) between adjacent DRAM cells 100 and 102, or cells 104 and 106, where FIG. 14B illustrates the depth "d" of a trench corresponding to cells 100, 102, 104, or 106. The Aspect Ratio (AR) of a DRAM device is defined as the ratio of depth "d" to separation "W" (i.e., d/W). As the device densities increase, "W," becomes smaller, leading to higher aspect ratios. Thus, to accommodate the higher densities, the trenches become narrower, which may lead to some fabrication difficulties. For example, when depositing oxide within the trench and on the trench walls, the high aspect ratio may cause the deposited material to grow in the shape of a bishop's miter, which may interrupt the material flow and generate a void that may result in operational deficiencies. In accordance with the present invention, the STI region allows for a reduction in trench depth "d," which leads to a lower AR. By having a lower AR, higher density vertical DRAM devices can be produced without encountering fabrication and manufacturing obstacles of the sort described in the Background section, above.

Figure 15:
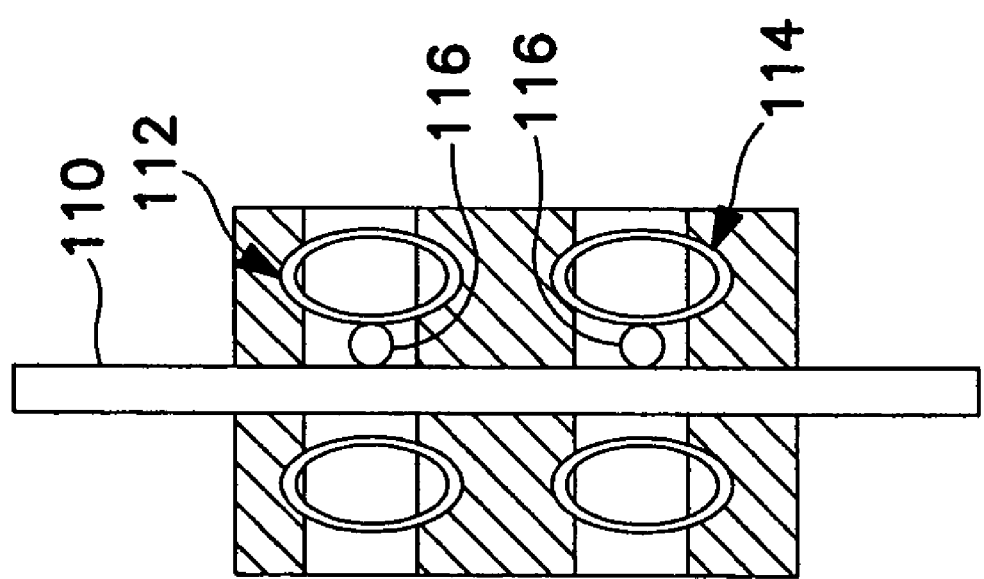

FIG. 15 shows a top plan view of a bitline 110 that connects to a series of DRAM cells, such as cells 112 and 114. As illustrated each cell connects to bitline 110 via borderless contacts 116. Charging and discharging of the storage capacitor within each cell is via a borderless contact such as borderless contact 116, and a bitline, such as bitline 110.

Figure 16:
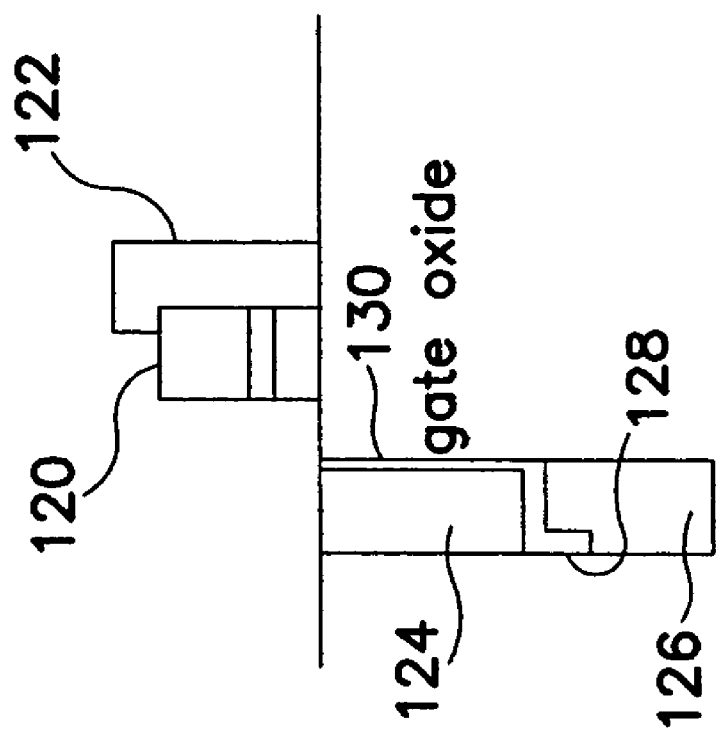

FIG. 16 shows a cross sectional view of a vertical DRAM cell having both a gate contact 120 and a bitline contact 122. As illustrated, the transistor is formed in region 124 (i.e., upper portion of trench), and the storage capacitor is formed in region 126 (i.e., lower portion of trench), where both the storage capacitor and transistor are connected by buried strap 128. To switch the transistor "ON," an appropriate voltage or electrical signal is applied to gate contact 120 via a wordline (not shown), which is part of the DRAM array architecture. The gate voltage generates the necessary electric field for driving the transistor into saturation along oxide collar region 130. Once the transistor is "ON," electrical storage charge is coupled via the bitline 110 (FIG. 15) to the bitline contact 122, and through the transistor channel (i.e., between drain and source) to the storage capacitor formed in region 126.

In addition to the embodiments of the aspects of the present invention described above, those of skill in the art will be able to arrive at a variety of other arrangements and steps which, if not explicitly described in this document, nevertheless embody the principles of the invention and fall within the scope of the appended claims. For example, the ordering of method steps is not necessarily fixed, but may be capable of being modified without departing from the scope and spirit of the present invention.

What is claimed is:

1. A vertical dynamic random access memory (DRAM) cell device fabricated within a trench region in a substrate, the trench region having first and second opposing substantially vertical edges extending from the device surface, the vertical DRAM cell comprising:
   (a) a storage capacitor formed within the trench region for storing electrical charge;
   (b) a transistor formed within the trench region above the storage capacitor;

(c) a buried strap having a top surface formed proximate to the first vertical edge between the storage capacitor and the transistor, the buried strap electrically coupling the storage capacitor and the transistor; and (d) an isolation collar region having a bottom edge, said collar region formed proximate to the second vertical edge of the trench, and said bottom edge extending past said transistor, but no further than about 100 nm below said top surface of said buried strap.

2. The cell device according to claim 1, further comprising a trench top oxide (TTO) region comprising a bottom surface, the bottom surface located above said top surface of the buried strap, wherein the trench top oxide and the buried strap are located between the transistor and the storage capacitor.

3. The cell device according to claim 2, wherein the top surface of the buried strap is vertically separated from the bottom surface of the trench top oxide by about 150 to 450 nm.

4. The cell device according to claim 1, wherein said bottom edge of the isolation collar region extends below the vertical location of the buried strap top surface between about 50 to 100 nm.

5. The cell device according to claim 4, wherein the buried strap comprises a one-sided strap.

6. The cell device according to claim 5, wherein the one-sided strap has a vertical dimension in the range of about 30 to 150 nm, and a lateral dimension in the range of about 50–100 nm.

7. The cell device according to claim 1, wherein said bottom edge of the isolation collar region is vertically separated from the top surface of the trench by between about 500–1000 nm.

8. The cell device according to claim 1, wherein the buried strap comprises a one-sided strap.

9. The cell device according to claim 8, wherein the one-sided strap has a vertical dimension in the range of about 30 to 150 nm, and a lateral dimension in the range of about 50 to 100 nm.

10. A buried strap for electrically connecting a transistor and a storage capacitor in a vertical dynamic random access memory (DRAM) cell device formed within a semiconductor substrate, said substrate defining a trench with first and second opposing vertical edges, the buried strap comprising: an electrically conducting region formed within the trench, the electrically conducting region formed proximate to the first opposing edge between the transistor and storage capacitor, and laterally displaced from an isolation region extending from the semiconductor substrate surface along the second opposing vertical edge and terminating at a bottom edge no lower than about 50–100 nm below a top surface of the buried strap.

11. The buried strap according to claim 10, being formed proximate the first opposing edge and laterally separated from the second opposing edge by about 50–110 nm.

12. The buried strap according to claim 10, wherein the isolation region has a depth no greater than about 250–350 nm.

13. The buried strap according to claim 10, wherein the isolation region comprises an oxide collar for electrically isolating the transistor and the storage capacitor in the vertical DRAM cell device from potential cross talk with an adjacent DRAM cell device.

14. The buried strap according to claim 10, wherein the electrically conducting region comprises undoped polysilicon.

15. The buried strap according to claim 10, wherein the electrically conducting region comprises doped polysilicon.

* * * * *